US008242688B2

(12) United States Patent
Kwon et al.

(10) Patent No.: US 8,242,688 B2
(45) Date of Patent: Aug. 14, 2012

(54) ORGANIC LIGHT EMITTING DISPLAY INCLUDING MAGNETIC SUBSTANCE DISPERSED IN FILLER AND METHOD OF MANUFACTURING THE SAME

(75) Inventors: Oh-June Kwon, Yongin (KR); Seung-Yong Song, Yongin (KR); Young-Seo Choi, Yongin (KR); Ji-Hun Ryu, Yongin (KR); Jin-Hwan Jeon, Yongin (KR); Sun-Young Jung, Yongin (KR); Charles Joo, Yongin (KR); Kwan-Hee Lee, Yongin (KR); Min-Soo Kim, Yongin (KR)

(73) Assignee: Samsung Mobile Display Co., Ltd., Yonging, Gyunggi-do (KR)

( * ) Notice: Subject to any disclaimer, the term of this patent is extended or adjusted under 35 U.S.C. 154(b) by 0 days.

(21) Appl. No.: 13/046,379

(22) Filed: Mar. 11, 2011

(65) Prior Publication Data

US 2011/0248625 A1 Oct. 13, 2011

(30) Foreign Application Priority Data

Apr. 13, 2010 (KR) ........................ 10-2010-0033895

(51) Int. Cl.
*H01J 1/62* (2006.01)
*H05B 33/04* (2006.01)

(52) U.S. Cl. ........................................ 313/504; 313/512
(58) Field of Classification Search ........... 313/504–512
See application file for complete search history.

(56) References Cited

U.S. PATENT DOCUMENTS

2004/0191566 A1 9/2004 Kikuchi et al.
2009/0009046 A1 1/2009 Oh et al.

FOREIGN PATENT DOCUMENTS

| JP | 2003-187966 A | 7/2003 |
| JP | 2004-265776 A | 9/2004 |
| JP | 2005-019300 A | 1/2005 |
| JP | 2006-221906 A | 8/2006 |
| KR | 10-0879864 B1 | 1/2009 |

*Primary Examiner* — Joseph L Williams
(74) *Attorney, Agent, or Firm* — Knobbe, Martens, Olson & Bear LLP

(57) ABSTRACT

An organic light emitting display and a method of manufacturing the same are disclosed. In one embodiment, the display includes i) a first substrate, ii) a second substrate facing the first substrate and iii) a display unit formed between the first and second substrates and including organic light emitting diodes (OLEDs). The display further includes i) a sealant formed between the first and second substrates so as to substantially surround the display unit, wherein the first and second substrates are bonded to each other via the sealant and ii) a filler formed at an inner side of the sealant to cover the display unit, and wherein a magnetic substance is dispersed in the filler.

21 Claims, 8 Drawing Sheets

ORGANIC LIGHT EMITTING DISPLAY INCLUDING MAGNETIC SUBSTANCE DISPERSED IN FILLER AND METHOD OF MANUFACTURING THE SAME

CROSS-REFERENCE TO RELATED PATENT APPLICATION

This application claims the benefit of Korean Patent Application No. 10-2010-0033895, filed on Apr. 13, 2010, in the Korean Intellectual Property Office, the disclosure of which is incorporated herein in its entirety by reference.

BACKGROUND

1. Field

The described technology generally relates to an organic light emitting display and a method of manufacturing the same, and more particularly, to an organic light emitting display capable of increasing structural durability and preventing deterioration of organic light emitting diodes (OLEDs), and a method of manufacturing the display.

2. Description of the Related Technology

An organic light emitting display emits light by using energy that is generated when electrons provided from one electrode are coupled with holes provided from another electrode, in an organic light emitting layer, and light emitting molecules of the organic light emitting layer, which are excited due to the coupling, returns to a ground state.

The organic light emitting display is regarded as a next-generation display due to excellent visibility, light weight, thin size and low-voltage driving.

SUMMARY

One aspect is an organic light emitting display capable of increasing structural durability and preventing deterioration of organic light emitting diodes (OLEDs).

Another aspect is a method of manufacturing the organic light emitting display.

Another aspect is an organic light emitting display including a first substrate; a second substrate facing the first substrate; a display unit formed between the first and second substrates and including organic light emitting diodes (OLEDs); a sealant formed between the first and second substrates to surround the display unit, and for bonding the first and second substrates to each other; and a filler formed at an inner side of the sealant to cover the display unit and including a magnetic substance dispersed in the filler.

The sealant may include frit. The frit may be formed on an inorganic insulating layer extending from the display unit and formed on the first substrate. The filler directly may contact an inner boundary surface of the sealant facing the display unit.

The magnetic substance may include a ferromagnetic substance or a ferrimagnetic substance. The magnetic substance may include a ferromagnetic substance or a ferrimagnetic substance heated to above a Curie temperature so as to lose magnetic properties. The magnetic substance may not have magnetic properties at a temperature at which the organic light emitting display apparatus operates.

Each of the OLEDs may include a first electrode; a second electrode facing the first electrode; and an organic light emitting layer formed between the first and second electrodes, and the filler may directly contact a whole surface of the second electrode. The apparatus may further include a protective film formed between the second electrode and the filler. The magnetic substance may have a particle diameter equal to or less than 1 μm.

Another aspect is a method of manufacturing an organic light emitting display apparatus, the method including preparing a first substrate, on which a sealant that surrounds a display unit including organic light emitting diodes (OLEDs) is formed, and a second substrate; loading a filler, in which a magnetic substance is dispersed, at an inner side of the sealant so as not to contact the sealant; aligning the first and second substrates to face each other and then bonding the first and second substrates to each other; curing the sealant; and magnetizing the magnetic substance by applying an external magnetic field from outside the sealant, and spreading the magnetized magnetic substance to an inner boundary surface of the sealant.

The sealant may include frit. The frit may be formed on an inorganic insulating layer extending from the display unit and formed on the first substrate. The magnetic substance may include a ferromagnetic substance or a ferrimagnetic substance.

The sealant may be cured by irradiating a laser along a sealing line of the sealant. The filler may directly contact the inner boundary surface of the sealant facing the display unit. External magnetic fields may be sequentially applied along an outside of the sealant.

The external magnetic fields may be simultaneously applied from outside the sealant. The method may further include removing magnetic properties of the magnetic substance by providing thermal energy corresponding to a Curie temperature of the magnetic substance, to the magnetic substance after the magnetic substance is magnetized and spread.

The magnetic properties of the magnetic substance may be removed at a temperature at which the organic light emitting display apparatus operates. The method may further include curing the filler after the magnetic substance is magnetized and spread. The method may further include removing magnetic properties of the magnetic substance after the filler is cured.

The method may further include removing magnetic properties of the magnetic substance before the filter is cured. The method may further include removing magnetic properties of the magnetic substance while the filter is cured. A Curie temperature of the magnetic substance may be within a temperature range for curing the filler.

Another aspect is an organic light emitting display comprising: a first substrate; a second substrate facing the first substrate; a display unit formed between the first and second substrates and comprising organic light emitting diodes (OLEDs); a sealant formed between the first and second substrates so as to substantially surround the display unit, wherein the first and second substrates are bonded to each other via the sealant; and a filler formed at an inner side of the sealant to cover the display unit, wherein a magnetic substance is dispersed in the filler.

In the above display, the sealant comprises a frit. The above display further comprises an inorganic insulating layer extending from the display unit and formed on the first substrate, wherein the frit is formed on the inorganic insulating layer.

In the above display, the filler directly contacts an inner boundary surface of the sealant facing the display unit. In the above display, the magnetic substance is formed at least partially of a ferromagnetic material or a ferrimagnetic material. In the above display, the magnetic substance is configured to lose magnetic properties when heated to above its Curie temperature. In the above display, the magnetic substance is configured to lose magnetic properties at a temperature at which the organic light emitting display operates.

In the above display, each of the OLEDs comprises: a first electrode; a second electrode facing the first electrode; and an organic light emitting layer formed between the first and second electrodes, and wherein the filler directly contacts i) a surface of the second electrode and ii) part of the first electrode.

The above display further comprises a protective film formed between the second electrode and the filler. In the above display, the magnetic substance comprises a plurality of substantially circular particles, and wherein each of the particles has a diameter less than or equal to about 1 μm. In the above display, the particle diameter is less than 0.05 μm.

Another aspect is a method of manufacturing an organic light emitting display, the method comprising: providing a display unit, comprising organic light emitting diodes (OLEDs), on a first substrate, forming a sealant so as to surround the display unit; providing a filler at an inner side of the sealant so as not to contact the sealant, wherein a magnetic substance is dispersed in the filler; substantially aligning the first substrate with a second substrate to face each other; bonding the first and second substrates to each other; curing the sealant; and magnetizing the magnetic substance based on an external magnetic field so that the magnetized magnetic substance is spread to an inner boundary surface of the sealant by the external magnetic field.

In the above method, the magnetic substance is formed at least partially of a ferromagnetic material or a ferrimagnetic material. In the above method, the curing is performed by irradiating a laser along a sealing line of the sealant.

In the above method, the magnetizing comprises sequentially applying external magnetic fields along an outside of the sealant. In the above method, the magnetizing comprises substantially simultaneously or substantially symmetrically applying external magnetic fields from outside the sealant.

The above method further comprises removing magnetic properties of the magnetic substance by providing thermal energy corresponding to a Curie temperature of the magnetic substance, to the magnetic substance after the magnetic substance is magnetized and spread. The above method further comprises curing the filler after the magnetic substance is magnetized and spread. The above method further comprising removing magnetic properties of the magnetic substance while or after the filter is cured. The above method further comprises removing magnetic properties of the magnetic substance before the filter is cured.

Another aspect is an organic light emitting display comprising: a first substrate; a second substrate facing the first substrate; a display unit formed between the first and second substrates and comprising organic light emitting diodes (OLEDs); a sealant formed between the first and second substrates so as to substantially surround the display unit, wherein the first and second substrates are bonded to each other via the sealant, and wherein an enclosed space is defined by the substrates and sealant; and a magnetic material filled in the enclosed space, wherein the magnetic material substantially covers the display unit and contacts at least one of the substrates.

DETAILED DESCRIPTION

Generally, organic light emitting displays deteriorate due to permeation of oxygen and moisture into the device. It is a common practice to seal organic light emitting diodes (OLEDs) by using an inorganic sealant such as frit in order to solve the above problem. The space between a substrate and a sealing substrate may be completely sealed by the frit sealing structure by curing the frit. Accordingly, an additional moisture absorbent may not be required and the OLEDs may be efficiently protected.

However, if an external impact is applied, since the frit is easily breakable, stress may be concentrated on a bonding surface between the frit and the substrate and thus cracks may be generated in the bonding surface and may spread to the whole substrate.

Figure 1:
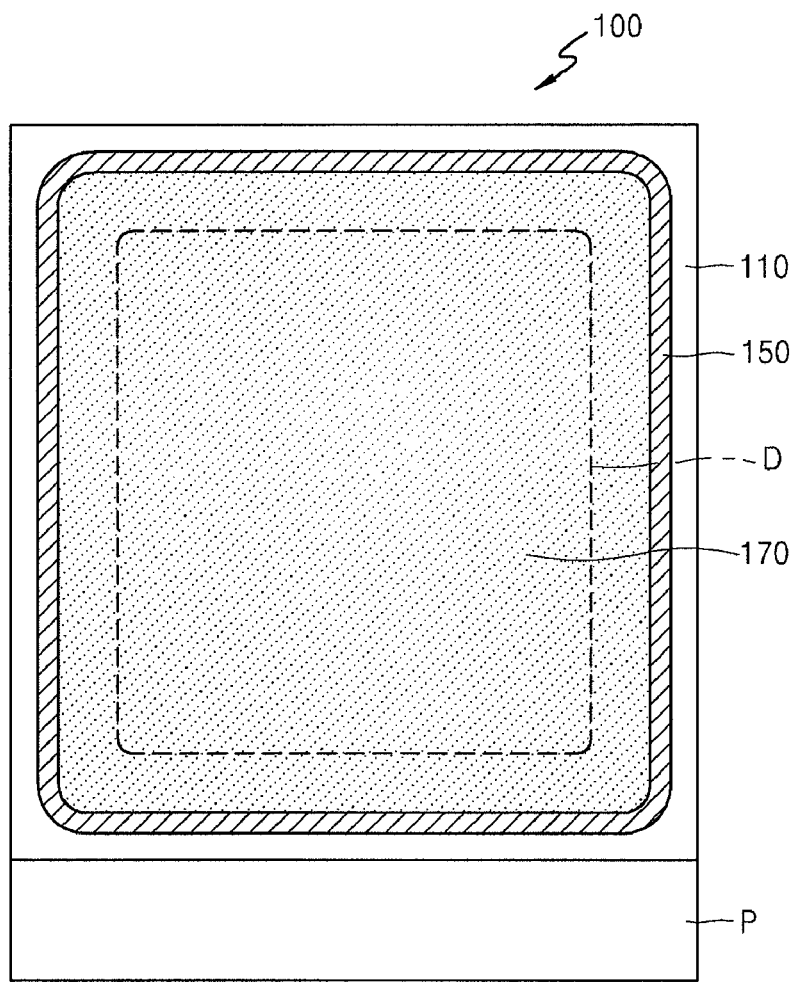
FIG. 1 is a partial plan view of an organic light emitting display according to an embodiment.
Figure 2:
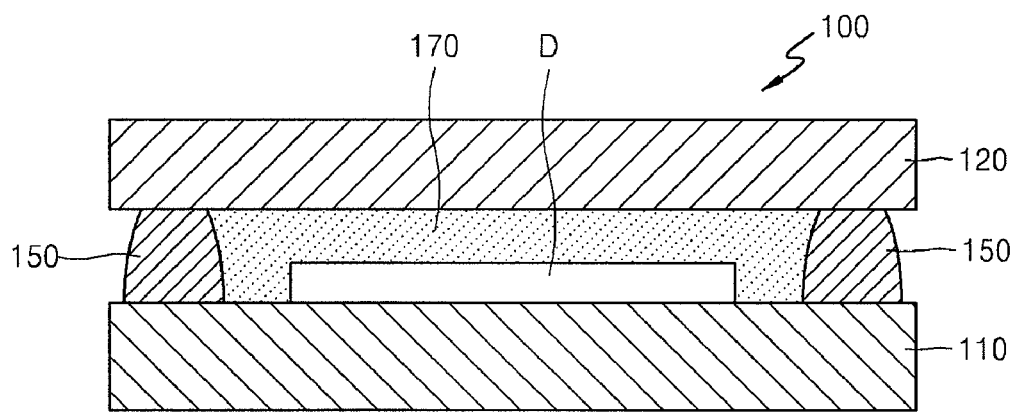
FIG. 2 is a cross-sectional view of the organic light emitting display illustrated in FIG. 1, to which a second substrate is bonded.
Figure 3:
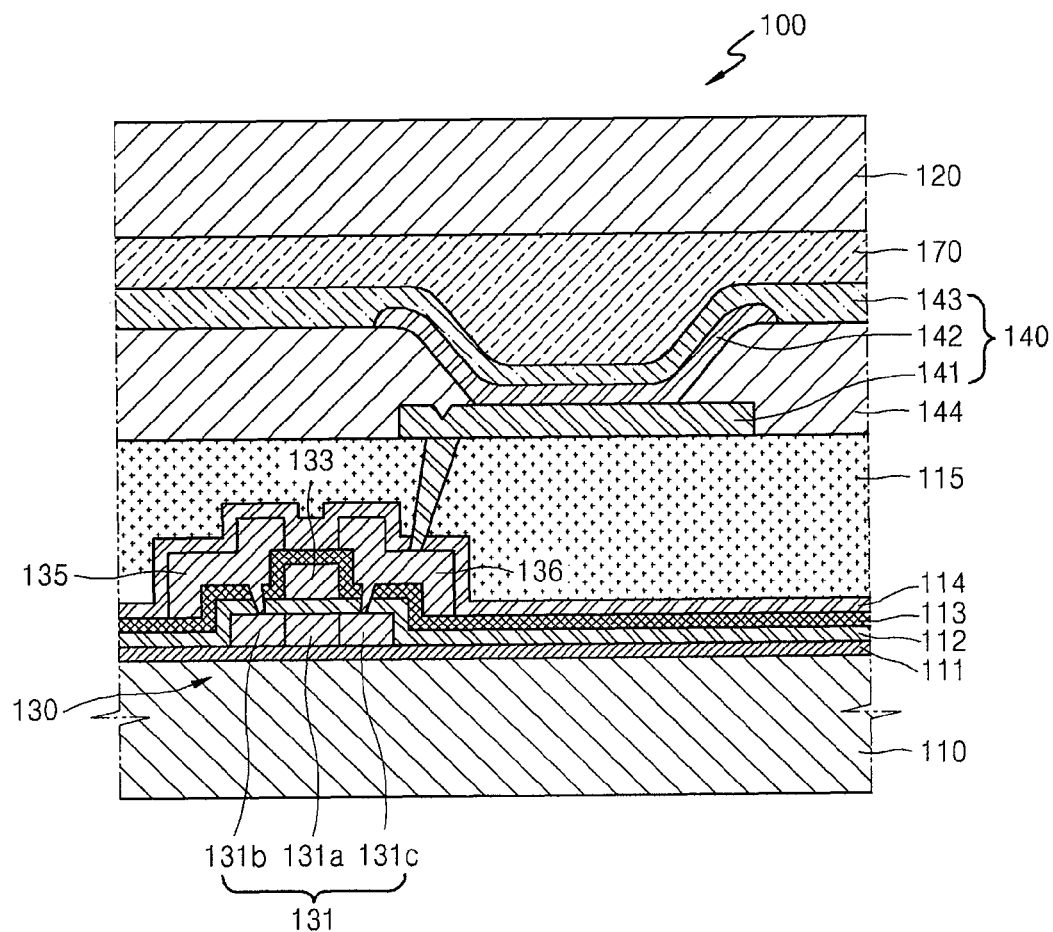
FIG. 3 is a detailed cross-sectional view of a display unit illustrated in FIGS. 1 and 2.

Embodiments will be described with reference to the attached drawings. Referring to FIGS. 1 through 3, the organic light emitting display 100 includes a first substrate 110, the second substrate 120, a sealant 150, and a filler 170 including a magnetic substance 180 (see FIG. 6A).

In one embodiment, a display unit D and a pad unit P are formed on a surface of the first substrate 110, which faces the second substrate 120, and the sealant 150 is formed outside the display unit D so as to surround the display unit D.

The display unit D includes a plurality of organic light emitting diodes (OLEDs) 140 and a plurality of thin film transistors (TFTs) 130 electrically connected to the OLEDs 140. A passive matrix (PM) type or an active matrix (AM) type may be determined according to whether the driving of the OLEDs 140 is controlled by the TFTs 130 or not. The organic light emitting display 100 may be applied to both the AM type and the PM type. Hereinafter, it is assumed, for the convenience of description, that the organic light emitting display 100 is the AM type.

In one embodiment, each of the first and second substrates 110 and 120 may be formed at least partially of a transparent glass substrate mainly including $SiO_2$. In another embodiment, the substrates 110 and 120 may also be formed of any one of various materials such as plastic.

An active layer 131 for covering the TFTs 130 is formed by using a semiconductor material on a buffer layer 111 that is formed on the first substrate 110, and a gate insulating film 112 is formed to cover the active layer 131 and the buffer layer 111. The active layer 131 may be formed at least partially of an organic semiconductor or an inorganic semiconductor such as amorphous silicon or polysilicon, and includes a source region 131b, a drain region 131c, and a channel region 131a formed between the source and drain regions 131b and 131c.

A gate electrode 133 is formed on the gate insulating film 112, and an interlayer insulating film 113 is formed to cover the gate electrode 133 and the gate insulating film 112. A source electrode 135 and a drain electrode 136 are formed on the interlayer insulating film 113. A passivation film 114 and a planarization film 115 are sequentially formed to cover the source and drain electrodes 135 and 136, and the interlayer insulating film 113.

Each of the gate insulating film 112, the interlayer insulating film 113, the passivation film 114, and the planarization film 115 may be formed at least partially of an insulator and may be formed in a monolayer or multilayer structure by using an inorganic material, an organic material, or an organic/inorganic compound. Meanwhile, the above TFT stacking structure is exemplarily described and any of various TFT structures may be used.

The pad unit P is formed outside the display unit D. In one embodiment, the pad unit P includes a plurality of pad electrodes (not shown) that are correspondingly electrically connected to various lines (not shown) included in the display unit D, e.g., data lines, scan lines or power supply lines for driving the organic light emitting display 100, so as to transmit external signals to the OLEDs 140 of the display unit D via the connected lines.

In one embodiment, a first electrode 141 functioning as an anode electrode of the OLEDs 140 is formed on the planarization film 115, and a pixel definition layer 144 is formed to cover the first electrode 141 and the planarization film 115 by using an insulator. An opening is formed in the pixel definition layer 144, and then an organic light emitting layer 142 of the OLEDs 140 is formed in a region defined by the opening. In one embodiment, a second electrode 143 functioning as a cathode electrode of the OLEDs 140 is formed to cover all pixels. In another embodiment, the first electrode 141 may function as a cathode electrode and the second electrode 143 may function as an anode electrode.

The first electrode 141 may be a transparent electrode or a reflective electrode. As a transparent electrode, the first electrode 141 may be formed at least partially of indium tin oxide (ITO), indium zinc oxide (IZO), zinc oxide (ZnO) or $In_2O_3$. As a reflective electrode, the first electrode 141 may include a reflective film formed at least partially of silver (Ag), magnesium (Mg), aluminum (Al), platinum (Pt), palladium (Pd), gold (Au), nickel (Ni), neodymium (Nd), iridium (Ir), chromium (Cr) or an alloy thereof, and a transparent film formed of, for example, ITO, IZO, ZnO or $In_2O_3$.

The second electrode 143 may also be a transparent electrode or a reflective electrode. As a transparent electrode, the second electrode 143 may include i) a film obtained by depositing, for example, lithium (Li), calcium (Ca), lithium fluoride (LiF)/Ca, LiF/Al, Al, Mg or an alloy thereof toward the organic light emitting layer 142, and ii) an auxiliary electrode or bus electrode line formed on the obtained film by using a transparent conductive material such as ITO, IZO, ZnO or $In_2O_3$. As a reflective electrode, the second electrode 143 may be formed at least partially of Li, Ca, LiF/Ca, LiF/Al, Al, Mg or an alloy thereof.

The organic light emitting layer 142 between the first and second electrodes 141 and 143 may be formed at least partially of a low or high molecular organic material. In one embodiment, if a low molecular organic material is used, a hole injection layer (HIL) (not shown), a hole transport layer (HTL) (not shown), an electron transport layer (ETL) (not shown), an electron injection layer (EIL) (not shown) and the like are stacked in a monolayer or multilayer structure by intervening the organic light emitting layer 142. Any of various low molecular organic materials such as copper phthalocyanine (CuPc), N,N'-di(naphthalene-1-yl)-N,N'-diphenyl-benzidine (NPB) and tris-8-hydroxyquinoline aluminum (Alq3) may be used. One of these low molecular organic materials may be deposited by using a mask.

In one embodiment, if a high molecular weight organic material is used, a HTL (not shown) may be further formed from the organic light emitting layer 142 toward an anode electrode. In this embodiment, the HTL is formed at least partially of poly(3,4-ethylenedioxythiophene) (PEDOT) and the organic light emitting layer 142 is formed at least partially of a high molecular weight organic material such as a polyphenylenevinylene (PPV)-based material or a polyfluorene-based material.

Although not illustrated in FIGS. 1 through 3, a spacer (not shown) for maintaining a gap between the OLEDs 140 and the second substrate 120 may be further formed on the pixel definition layer 144.

In one embodiment, the sealant 150 is formed on a surface of the first substrate 110, which faces the second substrate 120, so as to surround the display unit D. Alternatively, the sealant 150 may be formed on a surface of the second substrate 120, which faces the first substrate 110. The sealant 150 bonds the first and second substrates 110 and 120 to each other so as to prevent permeation of oxygen and moisture from outside the organic light emitting display 100 to the OLEDs 140.

Although an organic material such as epoxy may be used, the sealant 150 may be formed at least partially of an inorganic material that does not require an additional moisture absorbent, such as frit. The frit seals the first and second substrates 110 and 120 by coating a glass paste on the first substrate 110 and/or the second substrate 120, melting and curing the glass paste by irradiating it with a laser or an ultraviolet ray.

Meanwhile, if the sealant 150 is formed on the first substrate 110 by using frit, in order to increase the interface contact between the first substrate 110 and the frit that is an inorganic material, the frit may be formed directly on an inorganic insulating layer directly extending from the display unit D. Here, the inorganic insulating layer directly extending from the display unit D means that an inorganic insulating layer such as the gate insulating film 112, the interlayer insulating film 113 or the passivation film 114, which are formed when the TFTs 130 are formed, is also formed outside the display unit D.

However, if an external impact is applied to the organic light emitting display 100, since the frit is easily breakable, stress may be concentrated on a bonding surface between the frit and the first substrate 110 and/or the second substrate 120, and thus cracks may be generated in the bonding surface and may spread to a whole substrate.

In one embodiment, in order to solve this, the filler 170 is filled in an internal space formed when the first and second substrates 110 and 120 are bonded to each other. In one embodiment, the filler 170 is formed at least partially of an elastic and viscous material. Since the filler 170 fills the internal space of the organic light emitting display 100, the filler 170 prevents the display 100 from being damaged by an external impact.

In one embodiment, the sealant 150 including frit is cured by irradiating it with high-temperature ultraviolet radiation or with a laser. In this case, if the high-temperature ultraviolet radiation or the laser is also irradiated to the filler 170 adjacent to the sealant 150 and thus the filler 170 deteriorates due to the high temperature, deformation of the OLEDs 140 may be caused. If the filler 170 is formed not to contact the sealant 150 in order to prevent deterioration of the filler 170 due to the high temperature, that is, if the filler 170 is formed with a gap from an inner boundary surface of the sealant 150, the original function of the filler 170 for preventing damage due to an external impact may not be performed appropriately.

In one embodiment, in order to solve this problem, the magnetic substance 180 is dispersed in the filler 170.

The magnetic substance 180 may include a ferromagnetic substance or a ferrimagnetic substance. The ferromagnetic substance or the ferrimagnetic substance is a material that is strongly magnetized in the direction of a strong external magnetic field that is applied to the material, and retains its magnetic properties even after the external magnetic field disappears.

In one embodiment, the filler 170 including the magnetic substance 180 is formed by loading the filler 170 substantially on the center of the display unit D while maintaining a gap from the inner boundary surface of the sealant 150 so as not to contact the sealant 150 in order to prevent deterioration of the filler 170 due to a curing temperature of the sealant 150. In this embodiment, a magnetic field is applied from outside the sealant 150 such that the filler 170 is spread to the inner boundary surface of the sealant 150.

As such, the filler 170 of the organic light emitting display 100 may not be thermally damaged by high temperatures because the gap exists between the filler 170 and the inner boundary surface of the sealant 150, when the sealant 150 is cured. Further, the filler 170 may prevent deterioration of and may increase structural durability of the organic light emitting display 100 by directly contacting the inner boundary surface of the sealant 150 after the sealant 150 is cured.

In one embodiment, the magnetic substance 180 dispersed in the filler 170 substantially maintains the magnetic properties after the sealant 150 is cured. In another embodiment, the magnetic properties of the magnetic substance 180 is removed in a temperature range in which the organic light emitting display 100 operates, e.g., a range from about −20° C. to about 80° C.

Since a ferromagnetic substance or a ferrimagnetic substance may lose magnetic properties when heated to above its Curie temperature, the magnetic properties of the magnetic substance 180 may be removed by providing thermal energy to the magnetic substance 180 that is spread to the inner boundary surface of the sealant 150 after the sealant 150 is cured.

As illustrated in FIG. 3, the filler 170 in which the magnetic substance 180 is dispersed may directly contact the whole surface of the second electrode 143 of the OLEDs 140. Also, when the magnetic substance 180 is electrically conductive, if necessary, an insulating protective film may be further formed between the second electrode 143 and the filler 170.

Meanwhile, in order that the organic light emitting display 100 is formed to be thin, the distance between the first substrate 110, on which the display unit D is formed, and the second substrate 120 used as a sealing layer may be small. In the current embodiment, the distance between the first and second substrates 110 and 120 is about 2 μm to about 4 μm. In one embodiment, the magnetic substance 180 includes a plurality of substantially circular particles. Each of the particles may have a diameter less than or equal to at least about 1 μm. In another embodiment, the particle diameter of the magnetic substance 180 is less than 0.05 μm. In still another embodiment, a particle diameter of several ten to several hundred nanometers (nm), in order to prevent damage to the display unit D.

FIGS. 4 through 8 are diagrams for describing a method of manufacturing an organic light emitting display 100, according to an embodiment.

Figure 4:
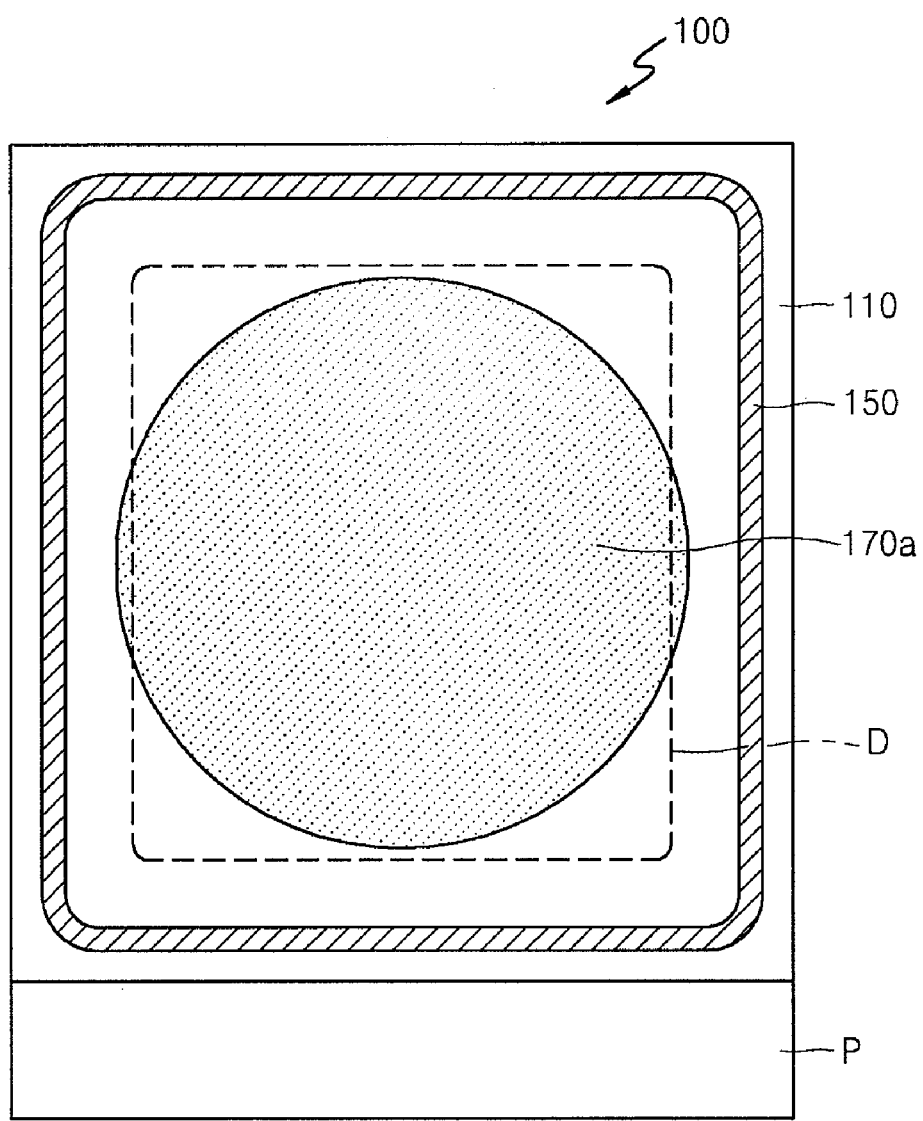
FIGS. 4 through 8 are diagrams for describing a method of manufacturing an organic light emitting display, according to an embodiment.

Referring to FIG. 4, a first substrate 110, on which a sealant 150 that surrounds a display unit D including OLEDs is formed, is prepared. Although not illustrated in FIG. 4, a second substrate 120 (see FIGS. 2 and 5) to be used as a sealing member is also prepared. In this case, the sealant 150 may be formed on the second substrate 120.

In this case, the sealant 150 may be formed at least partially of frit. As described above in relation to FIGS. 1 through 3, the frit may be formed directly on an inorganic insulating layer directly extending from the display unit.

In one embodiment, a filler 170a, in which a magnetic substance 180 (see FIG. 6A) having a particle diameter less than or equal to about 1 μm is distributed, is loaded at an inner side of the sealant 150 so as not to contact the sealant 150. In this case, the filler 170a is loaded at the center of the display unit D while maintaining a gap from an inner boundary surface of the sealant 150 so as not to contact the sealant 150. In another embodiment, the particle diameter of the magnetic substance 180 is less than 0.05 μm.

Figure 5:
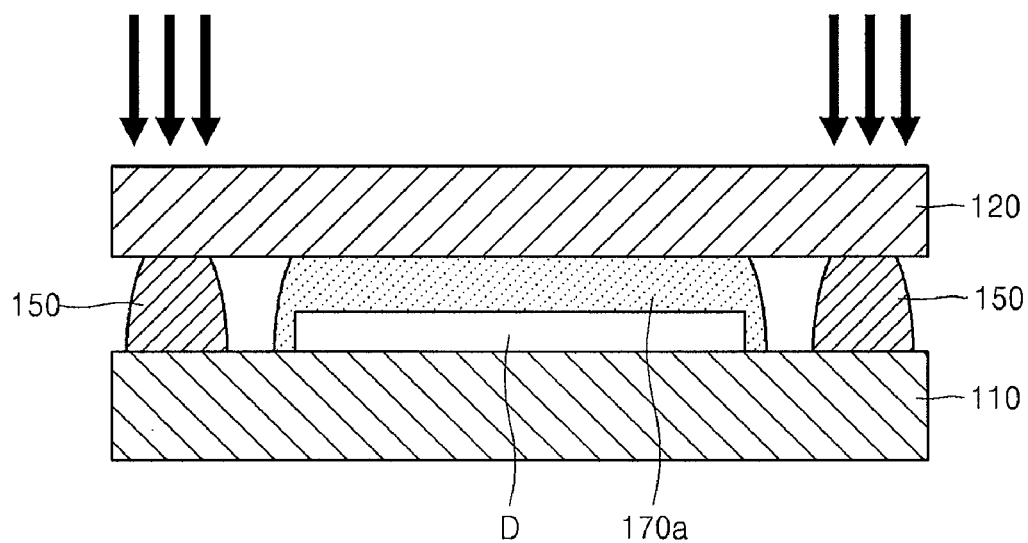

Referring to FIG. 5, the first and second substrates 110 and 120 are substantially aligned to face each other and then are bonded to each other. The sealant 150 is cured by irradiating a laser or ultraviolet radiation along a sealing line of the sealant 150 while the gap is maintained between the filler 170a and the sealant 150.

In this case, the filler 170a is separate from the sealant 150 and thus may avoid thermal damage caused by the irradiation by a laser or ultraviolet radiation.

Figure 6A:
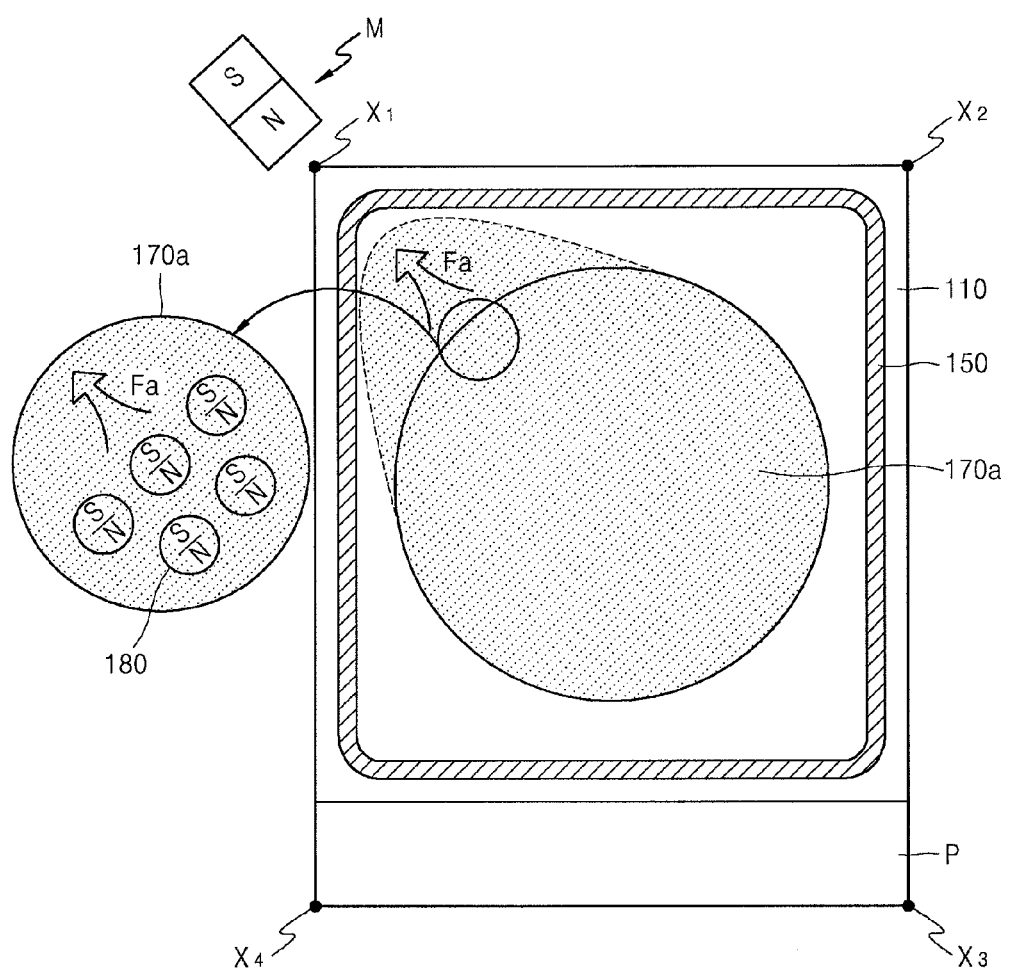

Referring to FIG. 6A, a magnet M is disposed outside the sealant 150. The magnet M illustrated in FIG. 6A is a general representation of a magnet for applying a magnetic field from outside the sealant 150, and the shape and the alignment of magnetic properties (south(S) and north (N) poles) of the magnet M are not limited to those as illustrated in FIG. 6A.

The magnet M is disposed outside the sealant 150 and at a first corner X1 of the first substrate 110 so as to form an external magnetic field extending at least partially through the sealant 150 to the filler 170a. In this case, since the filler 170a includes the magnetic substance 180, the filler 170a is pulled in the direction of the magnet due to the external magnetic field. If the magnetic substance 180 includes a ferromagnetic substance or a ferrimagnetic substance, the magnetic substance 180 is strongly drawn in the direction of the source of the external magnetic field. Thus, as illustrated in FIG. 6A, a strong magnetic force Fa is applied to the magnetic substance 180 by the magnet M, and thus the magnetic substance 180 included in the filler 170a moves in the direction of the magnetic force Fa. Accordingly, the filler 170a including the magnetic substance 180 spreads toward the first corner X1 and thus directly contacts the inner boundary surface of the sealant 150 near the first corner X1, thereby filling the gap between the sealant 150 and the filler 170a.

Figure 6B:
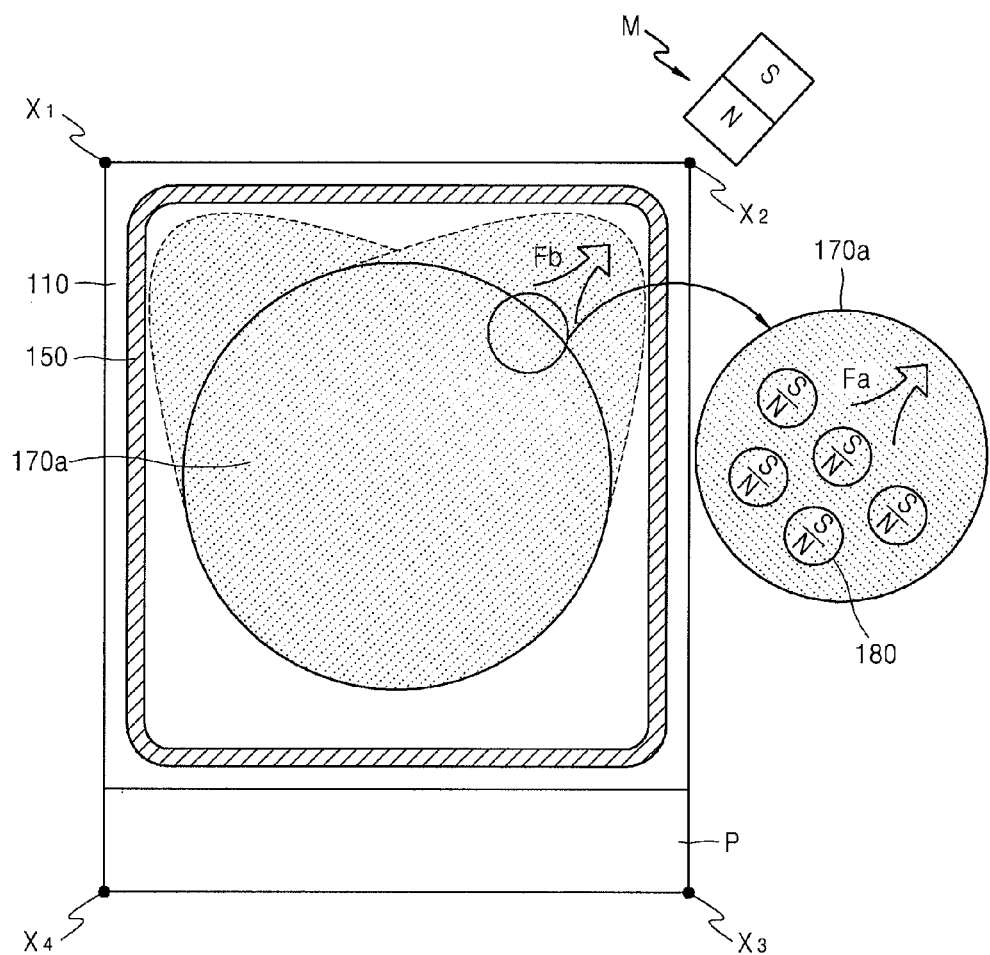

Referring to FIG. 6B, the magnet M is disposed outside the sealant 150 and at a second corner X2 of the first substrate 110 so as to apply an external magnetic field extending at least partially past the sealant 150 to the filler 170a. A strong magnetic force Fb is generated between the magnetic substance 180 and the magnet M, and thus the magnetic substance 180 included in the filler 170a moves in the direction of the magnetic force Fb. Accordingly, the filler 170a including the magnetic substance 180 spreads toward the second corner X2 and thus directly contacts the inner boundary surface of the sealant 150 near the second corner X2, thereby filling the gap between the sealant 150 and the filler 170a.

FIGS. 6A and 6B are diagrams for describing a method of substantially sequentially applying external magnetic fields along the outside of the sealant 150 by using the magnet M. Although not illustrated in FIGS. 6A and 6B, the magnet M may be disposed outside the sealant 150 and at third and fourth corners X3 and X4 of the first substrate 110 so as to sequentially form external magnetic fields. In this case, a strong magnetic force (not shown) is formed between the magnetic substance 180 and the magnet M, and thus the magnetic substance 180 included in the filler 170a spreads toward the third and fourth corners X3 and X4 so as to fill the gap between the sealant 150 and the filler 170a, thereby shaping the filler 170 illustrated in FIG. 1, which directly contacts the inner boundary surface of the sealant 150 facing the display unit D.

Figure 7:
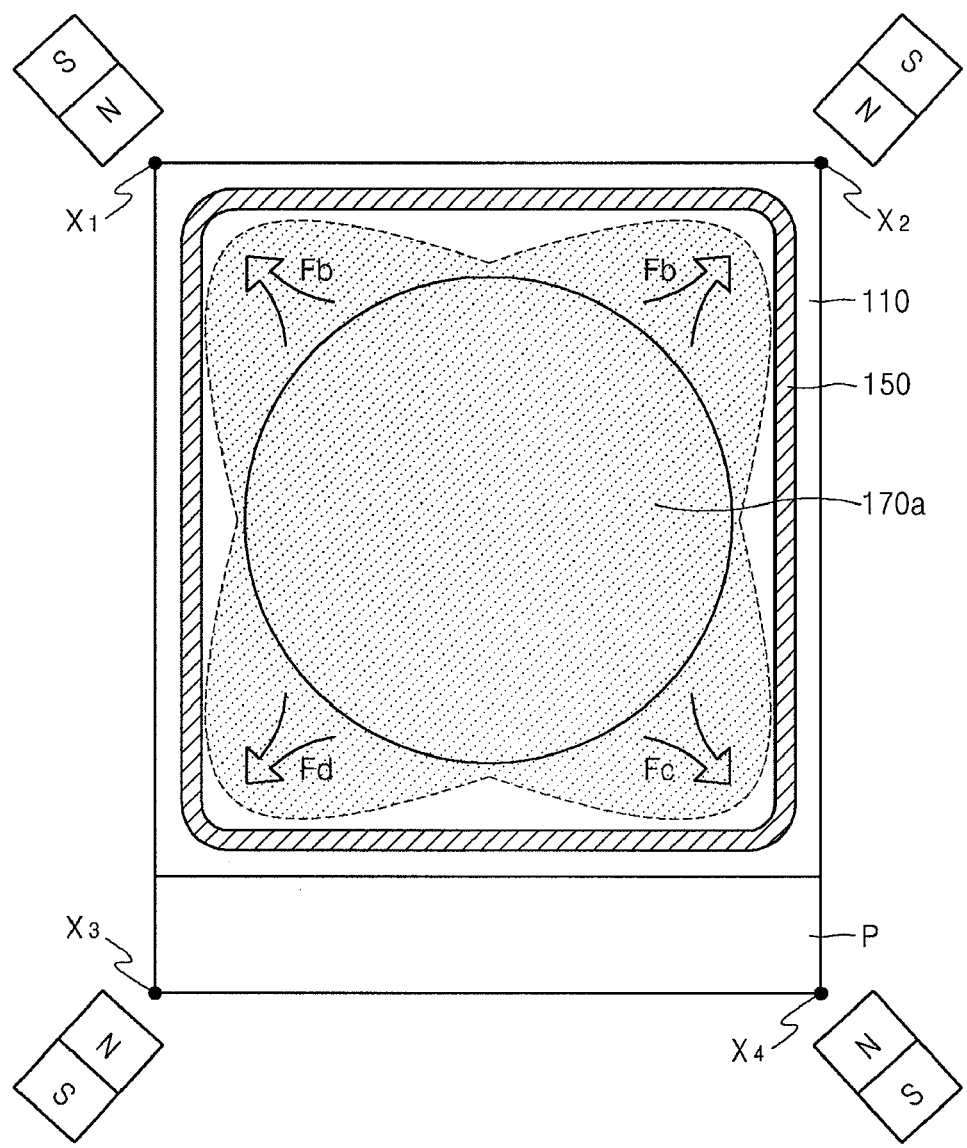

Alternatively, referring to FIG. 7, magnets M are disposed outside the sealant 150 and at first through fourth corners X1 through X4 of the first substrate 110 so as to substantially simultaneously apply external magnetic fields that extend through the sealant 150 at least partially into the filler 170a.

While the magnet M moves along the outside of the sealant 150 so as to sequentially apply external magnetic fields in FIGS. 6A and 6B, the external magnetic fields are substantially simultaneously applied outside the sealant 150 in FIG. 7.

For example, the magnets M are disposed outside the sealant 150 and at the first through fourth corners X1 through X4 of the first substrate 110 so as to substantially simultaneously exert the external magnetic fields to the filler 170a. In this case, the external magnetic fields may be substantially symmetrically applied. Accordingly, strong magnetic forces Fa through Fd are generated between the magnetic substance 180 and the magnets M, and thus the magnetic substance 180 included in the filler 170a moves in the directions of the magnetic forces Fa through Fd. Accordingly, the filler 170a including the magnetic substance 180 spreads toward the first through fourth corners X1 through X4, thereby filling the gap between the sealant 150 and the filler 170a.

Although FIGS. 6a, 6b, and 7 show that external magnetic fields are only applied at corners of the sealant 150 in consideration that large gaps are formed between the filler 170a and the corners of the sealant 150, the external magnetic fields may be applied at various other locations.

Figure 8:
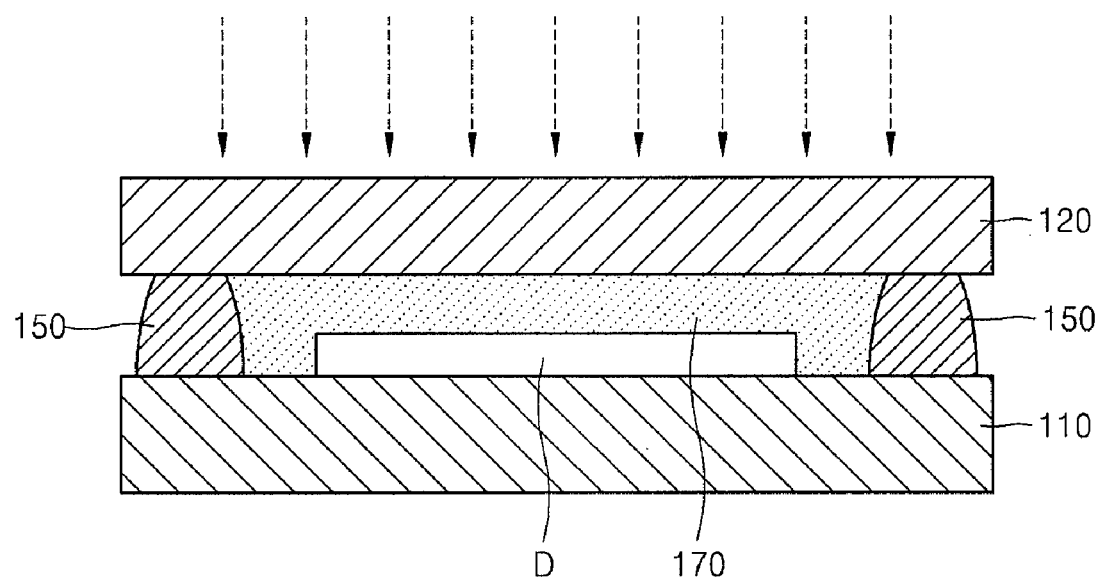

Referring to FIG. 8, after the sealant 150 is cured and the filler 170a including the magnetized magnetic substance 180 is spread to the inner boundary surface of the sealant 150, the filler 170 is cured by, for example, irradiating ultraviolet radiation. As such, the organic light emitting display 100 is completely formed as illustrated in FIG. 2.

In one embodiment, the magnetized magnetic substance 180 substantially maintains its magnetic properties after the sealant 150 is cured. In another embodiment, the magnetic properties of the magnetized magnetic substance 180 may is removed in a temperature range in which the organic light emitting display 100 operates, e.g., a range from −20° C. to 80° C.

Since a ferromagnetic substance or a ferrimagnetic substance may lose magnetic properties when heated to above its Curie temperature, the magnetic properties of the magnetic substance 180 may be removed by providing thermal energy to the magnetic substance 180 that is spread to the inner boundary surface of the sealant 150 after the sealant 150 is cured.

Meanwhile, the operation of removing the magnetic properties of the magnetic substance 180 by heating the filler 170 to above its Curie temperature may be performed after, before, or substantially simultaneously with the operation of curing the filler 170.

If the operation of removing the magnetic properties of the magnetic substance 180 is performed substantially simultaneously with the operation of curing the filler 170, the Curie temperature of the magnetic substance 180 included in the filler 170 may be within a temperature range for curing the filler 170.

As such, the filler 170a may not be thermally damaged by a high temperature because of the existence of the gap between it and the inner boundary surface of the sealant 150 when the sealant 150 is cured, and may prevent deterioration of and may increase structural durability of the organic light emitting display 100 by directly contacting the inner boundary surface of the sealant 150 after the sealant 150 is cured.

According to at least one embodiment, in an organic light emitting display and a method of manufacturing the same, as a sealant may be cured while a filler does not contact an inner boundary surface of the sealant and the filler may contact the inner boundary surface of the sealant after the sealant is cured, structural durability may be increased and deterioration of OLEDs may be prevented.

While certain embodiments have been shown and described with reference to the attached drawings, it will be understood by those of ordinary skill in the art that various changes in form and details may be made therein without departing from the scope of the following claims.

What is claimed is:

1. An organic light emitting display comprising:
   a first substrate;
   a second substrate facing the first substrate;
   a display unit formed between the first and second substrates and comprising organic light emitting diodes (OLEDs);
   a sealant formed between the first and second substrates so as to substantially surround the display unit, wherein the first and second substrates are bonded to each other via the sealant; and
   a filler formed at an inner side of the sealant to cover the display unit, wherein a magnetic substance is dispersed in the filler.

2. The display of claim 1, wherein the sealant comprises a frit.

3. The display of claim 2, further comprising an inorganic insulating layer extending from the display unit and formed on the first substrate, wherein the frit is formed on the inorganic insulating layer.

4. The display of claim 1, wherein the filler directly contacts an inner boundary surface of the sealant facing the display unit.

5. The display of claim 1, wherein the magnetic substance is formed at least partially of a ferromagnetic material or a ferrimagnetic material.

6. The display of claim 5, wherein the magnetic substance is configured to lose magnetic properties when heated to above its Curie temperature.

7. The display of claim 6, wherein the magnetic substance is configured to lose magnetic properties at a temperature at which the organic light emitting display operates.

8. The display of claim 1, wherein each of the OLEDs comprises:
   a first electrode;
   a second electrode facing the first electrode; and
   an organic light emitting layer formed between the first and second electrodes, and
   wherein the filler directly contacts i) a surface of the second electrode and ii) part of the first electrode.

9. The display of claim 8, further comprising a protective film formed between the second electrode and the filler.

10. The display of claim 1, wherein the magnetic substance comprises a plurality of substantially circular particles, and wherein each of the particles has a diameter less than or equal to about 1 µm.

11. The display of claim 10, wherein the particle diameter is less than 0.05 µm.

12. A method of manufacturing an organic light emitting display, the method comprising:
   providing a display unit, comprising organic light emitting diodes (OLEDs), on a first substrate,
   forming a sealant so as to surround the display unit;

providing a filler at an inner side of the sealant so as not to contact the sealant, wherein a magnetic substance is dispersed in the filler;

substantially aligning the first substrate with a second substrate to face each other;

bonding the first and second substrates to each other;

curing the sealant; and magnetizing the magnetic substance based on an external magnetic field so that the magnetized magnetic substance is spread to an inner boundary surface of the sealant by the external magnetic field.

13. The method of claim 12, wherein the magnetic substance is formed at least partially of a ferromagnetic material or a ferrimagnetic material.

14. The method of claim 12, wherein the curing is performed by irradiating a laser along a sealing line of the sealant.

15. The method of claim 12, wherein the magnetizing comprises sequentially applying external magnetic fields along an outside of the sealant.

16. The method of claim 12, wherein the magnetizing comprises substantially simultaneously or substantially symmetrically applying external magnetic fields from outside the sealant.

17. The method of claim 12, further comprising removing magnetic properties of the magnetic substance by providing thermal energy corresponding to a Curie temperature of the magnetic substance, to the magnetic substance after the magnetic substance is magnetized and spread.

18. The method of claim 12, further comprising curing the filler after the magnetic substance is magnetized and spread.

19. The method of claim 18, further comprising removing magnetic properties of the magnetic substance while or after the filter is cured.

20. The method of claim 19, further comprising removing magnetic properties of the magnetic substance before the filter is cured.

21. An organic light emitting display comprising:
a first substrate;
a second substrate facing the first substrate;
a display unit formed between the first and second substrates and comprising organic light emitting diodes (OLEDs);
a sealant formed between the first and second substrates so as to substantially surround the display unit, wherein the first and second substrates are bonded to each other via the sealant, and wherein an enclosed space is defined by the substrates and sealant; and
a magnetic material filled in the enclosed space, wherein the magnetic material substantially covers the display unit and contacts at least one of the substrates.

* * * * *